United States Patent
Cholasta

(10) Patent No.: US 10,216,322 B2
(45) Date of Patent: Feb. 26, 2019

(54) CAPACITIVE TOUCH SENSE UNIT COMPUTATION POWER REDUCTION USING KEYPAD ELECTRODES CROSSTALK

(71) Applicant: NXP USA, Inc., Austin, TX (US)

(72) Inventor: Petr Cholasta, Hutisko-Solanec (CZ)

(73) Assignee: NXP USA, Inc., Austin, TX (US)

( * ) Notice: Subject to any disclaimer, the term of this patent is extended or adjusted under 35 U.S.C. 154(b) by 116 days.

(21) Appl. No.: 15/421,601

(22) Filed: Feb. 1, 2017

(65) Prior Publication Data

US 2018/0217710 A1 Aug. 2, 2018

(51) Int. Cl.
| | |
|---|---|
| G06F 1/32 | (2006.01) |
| G06F 3/041 | (2006.01) |
| G06F 3/044 | (2006.01) |
| G06F 1/3234 | (2019.01) |
| G06F 1/3231 | (2019.01) |

(52) U.S. Cl.
CPC .......... *G06F 3/0416* (2013.01); *G06F 1/3231* (2013.01); *G06F 1/3262* (2013.01); *G06F 3/044* (2013.01); *G06F 1/32* (2013.01); *G06F 2203/04101* (2013.01)

(58) Field of Classification Search
CPC ...... G06F 3/0416; G06F 3/044; G06F 1/3231; G06F 1/3262
See application file for complete search history.

(56) References Cited

U.S. PATENT DOCUMENTS

| | | | |
|---|---|---|---|
| 7,375,535 B1 | 5/2008 | Kutz et al. | |
| 8,508,244 B2 | 8/2013 | Seguine | |
| 2007/0273561 A1* | 11/2007 | Philipp | G06F 3/04886 341/33 |
| 2008/0246723 A1* | 10/2008 | Baumbach | G06F 3/03547 345/156 |
| 2009/0033343 A1 | 2/2009 | Reynolds et al. | |
| 2011/0025629 A1 | 2/2011 | Grivna et al. | |
| 2011/0073384 A1* | 3/2011 | Osoinach | G06F 3/0416 178/18.06 |

(Continued)

FOREIGN PATENT DOCUMENTS

CN 103959651 A 7/2014

OTHER PUBLICATIONS

Quantum Research Group, Secrets of a Successful QTouch Design, Quantum Research Application Note AN-KD02, Rev. 1.03, 10/05, 11 pages.

(Continued)

*Primary Examiner* — Ariel A Balaoing

(57) ABSTRACT

A touch sensitive capacitive keypad system (300) is provided with a keypad sensing electrode (304) disposed within sensing proximity of multiple electrodes (E0-E9) and formed under a keypad touch panel having defined key areas, where the electrodes are respectively aligned with the defined key areas to facilitate touch detection at the keypad touch panel with a controller (310) that is configured to determine which of the plurality of defined key areas is being touched by detecting a predetermined signal characteristic at the keypad sensing electrode (304) before sequential scanning the plurality of capacitive key electrodes to identify which capacitive key electrode is aligned with a defined key area being touched.

20 Claims, 7 Drawing Sheets

(56) References Cited

U.S. PATENT DOCUMENTS

| | | |
|---|---|---|
| 2012/0261199 A1 | 10/2012 | Kuo et al. |
| 2012/0268422 A1* | 10/2012 | Hirakawa ............. G06F 1/3203 345/174 |
| 2013/0088372 A1 | 4/2013 | Lundstrum et al. |
| 2013/0154996 A1* | 6/2013 | Trend ...................... G06F 3/044 345/174 |
| 2015/0227229 A1 | 8/2015 | Schwartz et al. |

OTHER PUBLICATIONS

Burke Davison, Microchip Technology Inc., mTouch Sensing Solution Acquisition Methods Capacitive Voltage Divider, AN1478, 2013, pp. 1-28.

Petr Cholasta, U.S. Appl. No. 15/094,333, filed Apr. 8, 2016, entitled Capacitive Sensor Device and Method of Operation.

* cited by examiner

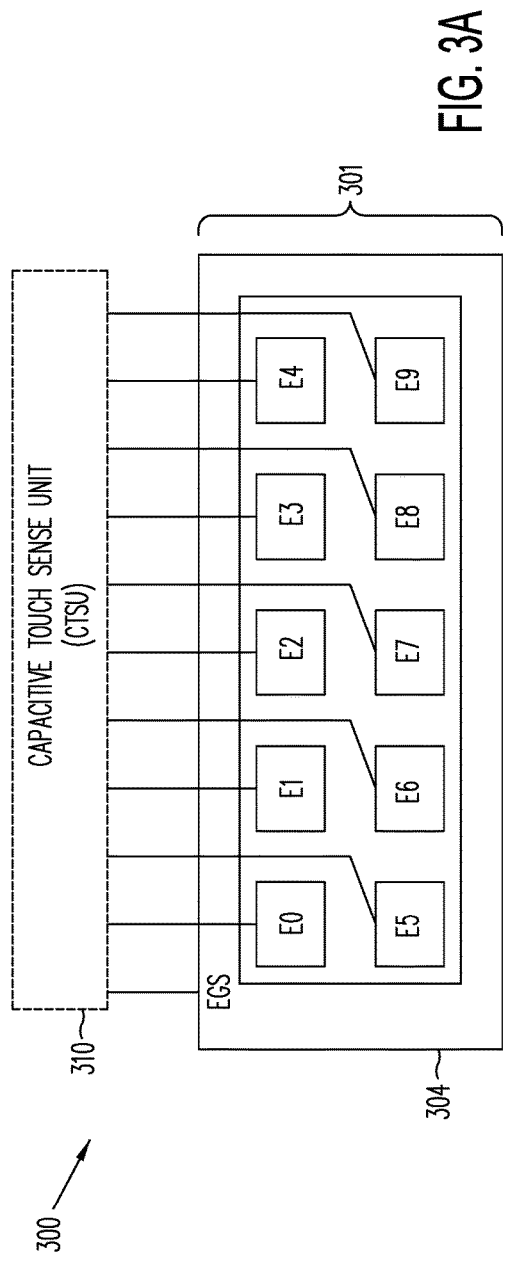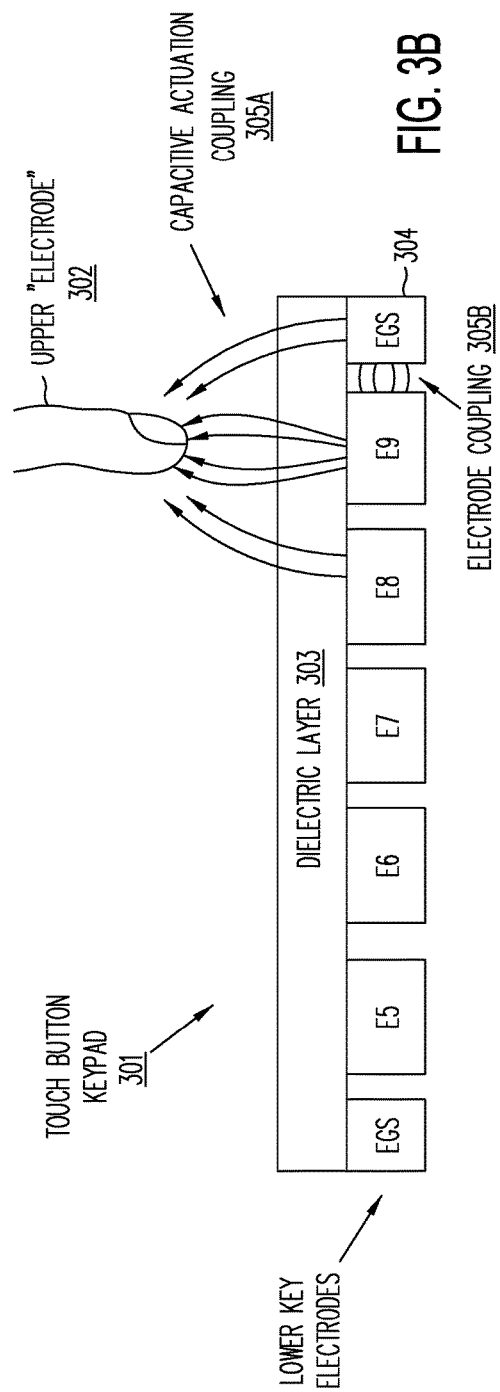

10,216,322 B2

CAPACITIVE TOUCH SENSE UNIT COMPUTATION POWER REDUCTION USING KEYPAD ELECTRODES CROSSTALK

BACKGROUND OF THE INVENTION

Field of the Invention

The present invention is directed in general to field of capacitive sensor devices. In one aspect, the present invention relates to a touch button keypad topology and keypad sense method, apparatus and system for determining the location of an object on a touch button keypad having a capacitive touch button keypad.

Description of the Related Art

Capacitive sensor devices are increasingly used to capture user input in a variety of electronic devices (e.g., cellular telephones, appliances, industrial equipment, MP3players, personal digital assistants (PDAs), tablet computers and other similar portable electronic devices) and automotive applications (e.g., car steering wheel control buttons, HVAC control panel, overhead console, etc.). Examples of such capacitive sensor devices include touch button keypads which use capacitive keypads or buttons to sense user touch inputs to provide data input for one or more applications. Touch button keypads have advantages over conventional input keypads because they do not have complex mechanical parts that can be expensive to manufacture and can wear out or break and because they can be completely sealed to the external environmental conditions that can degrade the contacts or get inside the product provoking malfunctions. To capture user input, touch button keypads typically employ capacitive keypads in which each keypad is configured as an electrode which functions as a capacitor plate to interact with a second "plate" formed by the human touch or other input device to measure a touch voltage which is converted into digital form by an analog-to-digital converter (ADC), thereby enabling detection of a change in a signal due to capacitive coupling created by a touch on the touch panel. In operation, an electric field that is applied to electrodes below the touch panel is changed or altered in the vicinity of a detected touch because the touch capacitively couples with the electrode(s). The change in the field is detected and used to determine the touch location. With touch panel designs, there a number of disadvantages associated with conventional approaches, particularly in relation to the computational requirements, and power consumption associated with accurately monitoring and sensing multiple, different keypad electrodes. As seen from the foregoing, the existing capacitive touch button keypad solutions are extremely difficult at a practical level by virtue of the difficulty in accurately and efficiently capturing keypad inputs, especially with keypads employing multiple capacitor electrodes which require increased computation support and power consumption while introducing measurement inaccuracies due to process variations associated with the fabrication and measurement of capacitor electrodes.

BRIEF DESCRIPTION OF THE DRAWINGS

The present invention may be understood, and its numerous objects, features and advantages obtained, when the following detailed description of a preferred embodiment is considered in conjunction with the following drawings.

FIG. 3A depicts a simplified block diagram of a capacitive touch button keypad system employing a global sense electrode in accordance with selected embodiments of the present disclosure.

FIG. 3B depicts a simplified cross-sectional view of the touch button keypad and global sense electrode shown in FIG. 3A.

DETAILED DESCRIPTION

An apparatus, system, and methodology are described for providing a capacitive keypad with improved performance by using a global sense electrode that is periodically scanned to detect keypad electrode touch events, thereby initiating a sequential scan of the keypad electrodes to locate which specific electrode was touched. In selected embodiments, the global sense electrode is deployed around and/or under the capacitive keypad electrodes in an arrangement which enables detection of crosstalk between the global sense electrode and keypad electrodes. During periodic scanning of the global sense electrode, power consumption and computational requirements are reduced by eliminating the need to scan all of the keypad electrodes at every periodic scanning interval, instead initiating sequential scanning of the keypad electrodes only when a keypad electrode touch event is detected with a measurement of the global sense electrode. In addition to providing a first keypad electrode sensing cycle for use in periodic scanning of the global sense electrode, selected embodiments of the present disclosure may employ an additional keypad electrode sensing cycle to gather a baseline reference voltage measurement from a different keypad electrode at each periodic scanning cycle. For example, in a first scanning cycle, the global sense electrode and a first keypad electrode (e.g., E0) may be scanned with a first and second sensing cycle, respectively, where the first sensing cycle measures the global sense electrode to detect a keypad electrode touch event and where the second sensing cycle measures the baseline reference voltage $VCAP_{E0}$ for the first keypad electrode. Continuing with this example, a second, subsequent scanning cycle may be employed to scan the global sense electrode and a second keypad electrode (e.g., E1) with a first and second sensing cycle, respectively, where the first sensing cycle measures the global sense electrode to detect a keypad electrode touch event and where the second sensing cycle measures the baseline reference voltage $VCAP_{E1}$ for the second keypad electrode. By repeating the scanning cycles to sequentially step through each of the keypad electrodes, baseline reference voltages may be collected for use in accurately detecting keypad touch events, thereby avoiding problems introduced by process variations in the electrode formation and/or environmental conditions. This mode may continue until a keypad electrode touch event is detected, at which time a keypad scan mode is initiated to periodically scan all of the keypad electrodes (e.g., at periodic scanning intervals) to detect which keypad electrode was touched, and then to continue scanning all of the keypad electrodes until detecting that the keypad electrode is released, at which point the method reverts back to the low power or sleep mode where only a subset of the electrodes, including at least the global scan electrode, are scanned.

Figure 1:
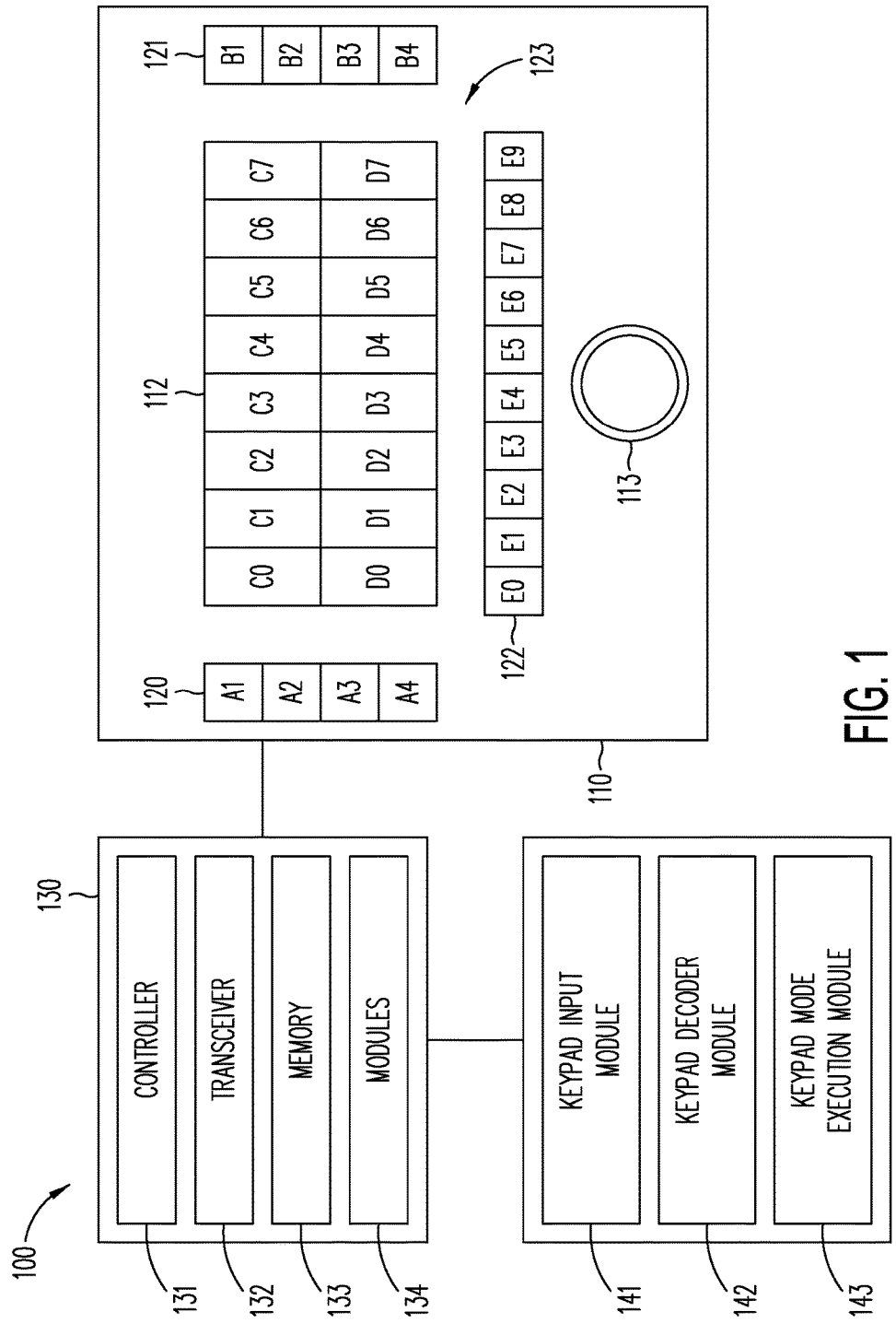
FIG. 1 depicts a simplified schematic block diagram of a capacitive touch sensing keypad system in accordance with selected embodiments of the present disclosure.

To provide a contextual understanding for selected embodiments of the present disclosure, reference is now made to FIG. 1 which shows a simplified schematic block diagram of a capacitive touch sensing keypad system 100 in accordance with selected embodiments of the present disclosure. While the keypad system 100 may be implemented in any of a variety of automotive applications, such as a HVAC or radio control panel, overhead console, or the like, the capacitive touch sensing keypad system 100 represents a wide variety of electronic devices, such as mobile communication devices, appliances, point of sale, medical and industrial applications using touch panels and touch screens, including but not limited to portable media devices, MP3 players, mobile phones, messaging devices, personal digital assistants (PDAs), notebook or laptop computers incorporating communication modems, mobile data terminals, application specific gaming devices, video gaming devices incorporating wireless modems, or any other type of electronic device having a keyboard-based input which uses capacitive, proximity or electric field sensors.

As depicted, the device 100 includes a display casing 110 for assembling a display screen 112, one or more control buttons 113 (e.g., menu or cursor button or dial), and a plurality of touch sensitive keypads 120-123, the operative functionality is controlled by internal software modules and hardware circuits 130. The depicted touch sensitive keypads 120-123 include a first plurality of plurality of capacitive key electrodes A1-A4 120, a second plurality of plurality of capacitive key electrodes B1-B4 121, and a third plurality of capacitive key electrodes E0-E9 122 which are shown as being arranged on different sides of the display screen 112 which may also include a plurality of designated screen capacitive key electrodes C0-C6, D0-D7 123 arranged in rows across the display screen 112. As will be appreciated, each of the capacitive key electrodes 120-123 may be arranged in any desired configuration, such as a linear array, a numeric keypad, a QWERTY keypad and/or may include fewer or more keys than shown. However arranged, each of the touch sensitive capacitive key electrodes 120-123 is electronically coupled to provide user input to the internal circuit/modules 130 which include a controller or processor 131, transceiver 132, memory 133, and modules 134. The controller 131 is configured to receive user input from each of the touch sensitive capacitive key electrodes 120-123 to specify or execute particular functions of the device.

The modules 134 can include a keypad input receiving module 141 for receiving user input to a keypad of the electronic device, and a keypad decode module 142 for demultiplexing and decoding the detected output from each of the capacitive key electrodes 120-123, and a keypad function executing module 143 for executing a function of a mode for keypad input of the electronic device 100 according to the user input to the capacitive key electrodes 120-123. The modules 134 and others can carry out certain processes of the methods as described herein, and may be implemented in software, such as in the form of one or more sets of prestored instructions, and/or hardware, which can facilitate the operation of the mobile station or electronic device as discussed below. The modules 134 may be installed at the factory or can be installed after distribution by, for example, a downloading operation. The operations in accordance with the modules will be discussed in more detail below.

Figure 2:
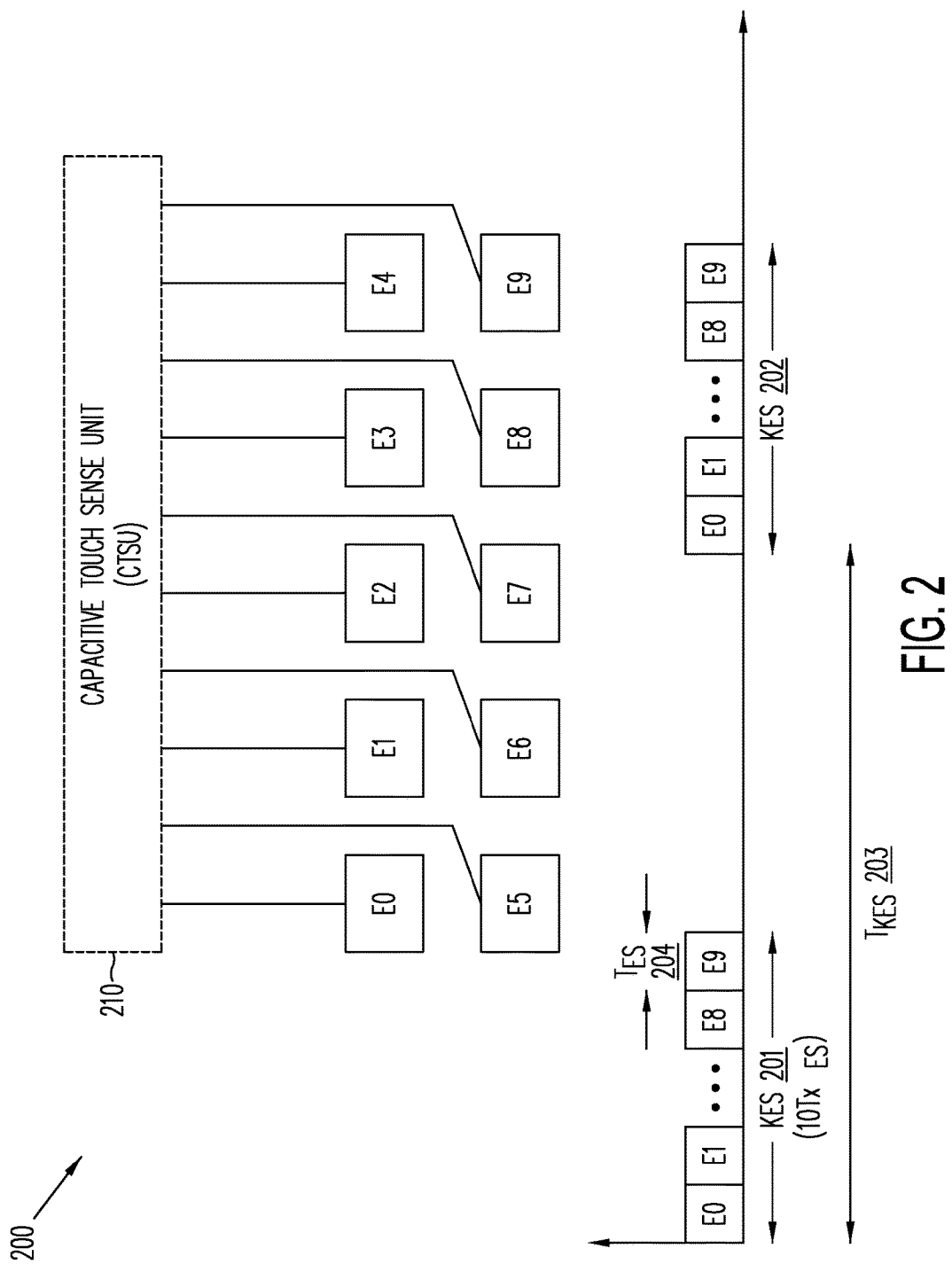
FIG. 2 depicts a simplified block diagram of a conventional capacitive touch button keypad system in which key electrodes are sequentially scanned at periodic key electrode scan (KES) intervals.

Referring now to FIG. 2, there is shown a simplified block diagram of a conventional capacitive touch button keypad system 200 in which key electrodes E0-E9 are sensed by Capacitive Touch Sense Unit (CTSU) 210 which sequentially scans all of the touch electrodes E0-E9 at periodic key electrode scan (KES) intervals to detect any electrode touch or release events. In particular, the CTSU 210 is configured to scan all of 10 keypad electrodes, from E0 to E9, with a Keypad Electrodes Sense (KES) cycle 201, 202 that repeats at a periodic scanning interval $T_{KEs}$ 203. In each KES cycle (e.g., 201), the CTSU 210 scans all of the touch electrodes with sequential series of electrode sensing cycles (e.g., 204), each requiring period $T_{Es}$. In order to determine which key electrode is touched or released, the keypad electrode sensing process requires that all 10 electrodes E0-E9 be sensed over a Keypad Electrodes Sense (KES) cycle 201, 202 having a duration of $10*T_{ES}$ that is repeated at the periodic scanning interval $T_{KES}$ 203. With this electrode scanning arrangement, it can be seen that the CTSU 210 is devoting computational resources and consuming power over the entirety of each KES cycle to detect touch and release events, even when there is no activity at the key electrodes.

To address the performance drawbacks associated with conventional capacitive touch button keypad systems, a global sense electrode may be arranged and positioned within sensing proximity of a keypad array of capacitive key electrodes in order to facilitate more efficient touch/release detection arrangement wherein sequential scanning of the keypad array is initiated only after the global sense electrode senses an electrode touch event. An example arrangement is depicted in FIGS. 3A-B which depict a simplified block diagram and cross-sectional view of a capacitive touch button keypad system 300 wherein a global sense electrode 304 is deployed as part of the touch button keypad 301 to surround the plurality of capacitive key electrodes E0-E9 arranged as a 10 key numeric keypad, though additional or fewer keys may be used and arranged in any suitable configuration. In selected embodiments, the global sense electrode 304 is provided as an additional electrode that can surround the keypad electrodes E0-E9, though the global sense electrode 304 can be positioned below the keypad electrodes E0-E9 or in any other physically proximate location that is suitable for detecting touch or release events at the key electrodes E0-E9. Thus positioned, the Capacitive Touch Sense Unit (CTSU) 310 may be connected across the global sense electrode 304 to measure crosstalk by detecting capacitive changes with reference to the keypad electrodes E0-E9 whenever a human touch or other input device makes proximate contact with the keypad electrodes E0-E9. In particular and as illustrated with the simplified cross-sectional view of the touch button keypad 301 shown in FIG. 3B, a human touch or other input device which makes proximate or actual contact with the keypad touch panel dielectric layer 303 acts as an upper "electrode" 302 to capacitively actuate 305 one of the lower keypad electrodes (e.g., E9) along with one or more surrounding electrodes (e.g., E3, E4, E8, and EGS), thereby generating crosstalk with the global sense electrode 304 which may be detected by the CTSU 310 to signify either a touch or release event.

In particular, the crosstalk is caused by capacitive actuation coupling 305A between the finger 302 and EGS electrode 304 and also by electrode coupling 305B between the activated electrode (e.g., E9) and the EGS electrode 304.

With the addition of a global sense electrode 304, the CTSU 310 may be configured to efficiently detect a touch or release event at the touch button keypad 301 by measuring crosstalk appearing at the global sense electrode 304, at which point the CTSU may initiate a sequence for sequentially scanning each of the key electrodes E0-E9 at periodic scanning intervals $T_{KES}$. For example and as illustrated with reference to FIG. 4, a first timing diagram 401 depicts the global sense electrode as being periodically sensed with a first sensing cycle EGS 410 having a sense duration $T_{ES}$. For so long as the keypad electrodes are not touched, the capacitive touch button keypad system is in a low power or sleep mode so that the global sense electrode can continue to be monitored with the first sensing cycle EGS applied at periodic scanning intervals $T_{KES}$.

Figure 4:
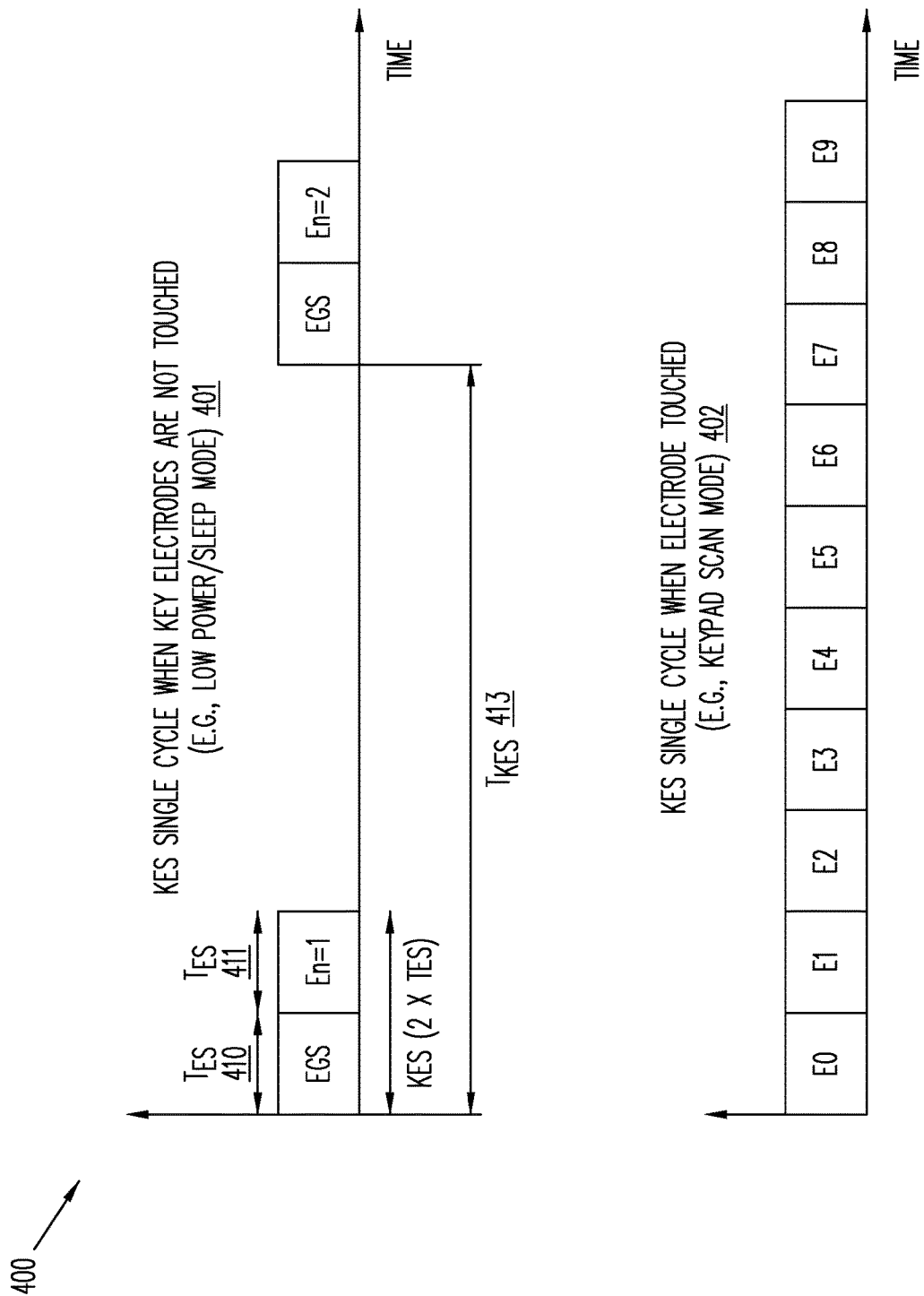
FIG. 4 depicts simplified timing diagrams of a low power scan mode and keypad scan mode for a capacitive touch button keypad employing a global sense electrode in accordance with selected embodiments of the present disclosure.

In addition to the periodic monitoring of the global sense electrode, the CTSU 310 may be configured to efficiently collect baseline reference voltage measurements from the different keypad electrodes by using a second, additional sensing cycle 411 at each periodic keyboard electrode scanning cycle. In FIG. 4, the first timing diagram 401 depicts the additional sensing cycle En 411 as being paired with the global sense electrode sensing cycle EGS and having the same sense duration $T_{ES}$ so that the CTSU may be configured to scan the global sense electrode (for keypad touch/release events) and a single keypad electrode En (for collecting baseline reference voltage measurements), where "n" is each KES cycle changing from 0 to 9. The resulting keypad electrode sensing of 2 electrodes EGS and En takes period of $2*T_{ES}$, and is applied to sequentially to increment the keypad electrode being sensed until baseline reference voltage measurements are collected for the entire keypad. By collecting the baseline reference voltage measurements over time, the keypad sensor performance may be adjusted continuously to the environment by using the baseline reference voltage measurements to auto-calibrate to external conditions. As a result, the performance of the keypad sensor is less affected by conditions that can impair or prevent correct functions in other devices.

Once the CTSU 310 detects a keypad touch event by detecting a capacitance change at the global sense electrode 304, CTSU 310 initiates a sequence of sensing cycles to sequentially measure each of the key electrodes E0-E9. In FIG. 4, this is illustrated with the second timing diagram 402 which depicts the keypad scan mode upon detecting that an electrode was touched by applying the sensing cycles E0-E9 to detect which specific keypad electrode was touched. In the keypad scan mode, the sensing cycles E0-E9 are repeated at a periodic scanning interval $T_{KES}$ until such time as a release event is detected, at which time the CTSU 310 reverts back to the low power or sleep mode.

As will be appreciated, selected embodiments of the present disclosure may be advantageously used in systems where the input keypad is usually not used or touched. For example, there are various automotive applications (e.g., car steering wheel control buttons, HVAC and/or radio control panels, overhead consoles, etc.) where the input keypad is not being used since the car driver is spending most of the time focusing on driving the vehicle. Of course, there are other applications (e.g., washing machines, microwaves, etc.) where keypads are infrequently used to control the systems. During these long intervals of not being used, the capacitive touch button keypad systems which use the global sense electrode to initiate a keypad scan mode can reduce power consumption and use of computational resources by 5-10 times as compared to conventional capacitive touch button keypad systems, depending on the number of keypad electrodes being scanned and/or measured for baseline reference voltage measurements.

Figure 5A:
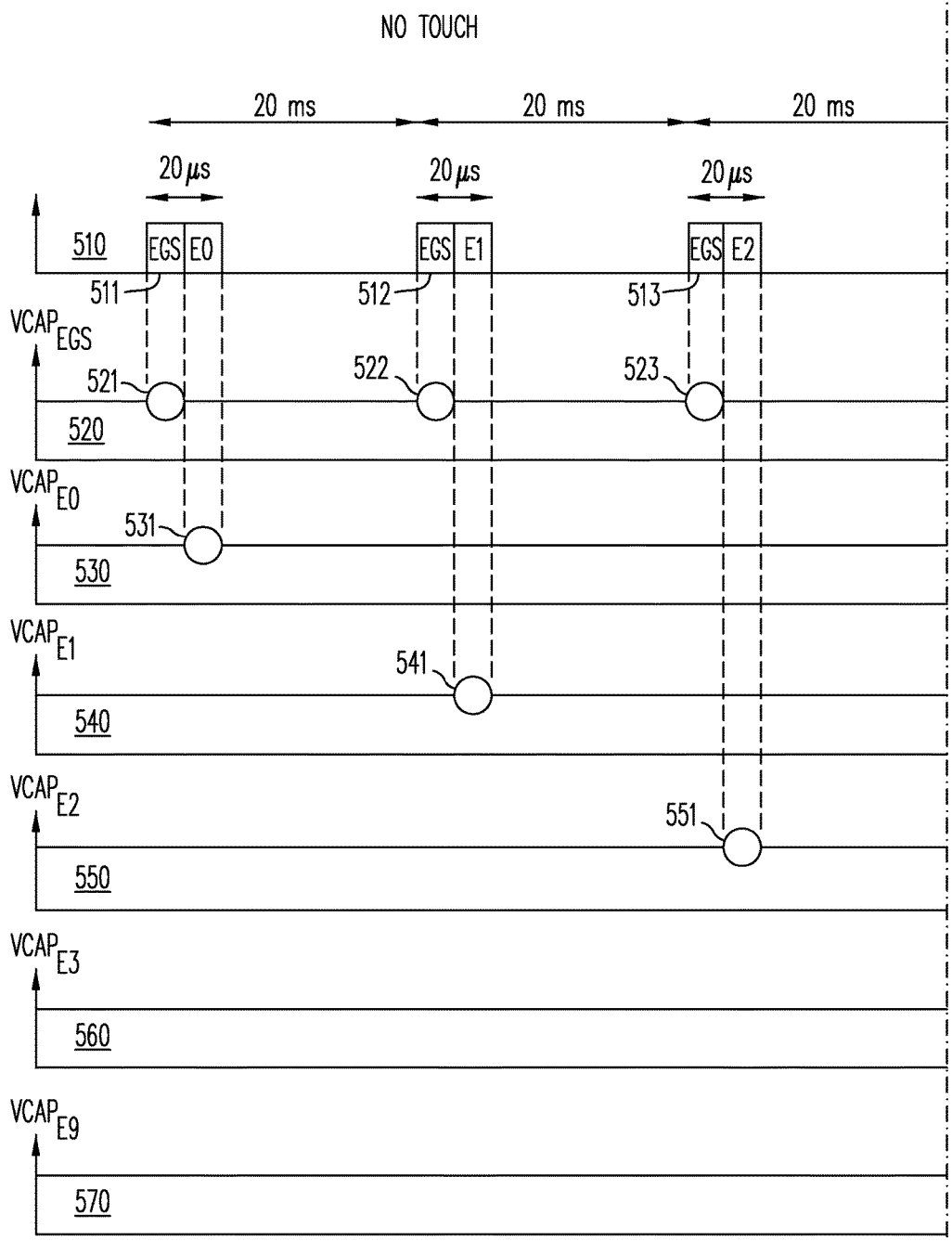
FIGS. 5A-5B (referred to herein as FIG. 5) graphically depict output response curves for the touch panel sensing electrodes to illustrate how a global sense electrode detects crosstalk with an activated keypad key to initiate sequential scanning of the keypad key electrodes in accordance with selected embodiments of the present disclosure.
Figure 5B:
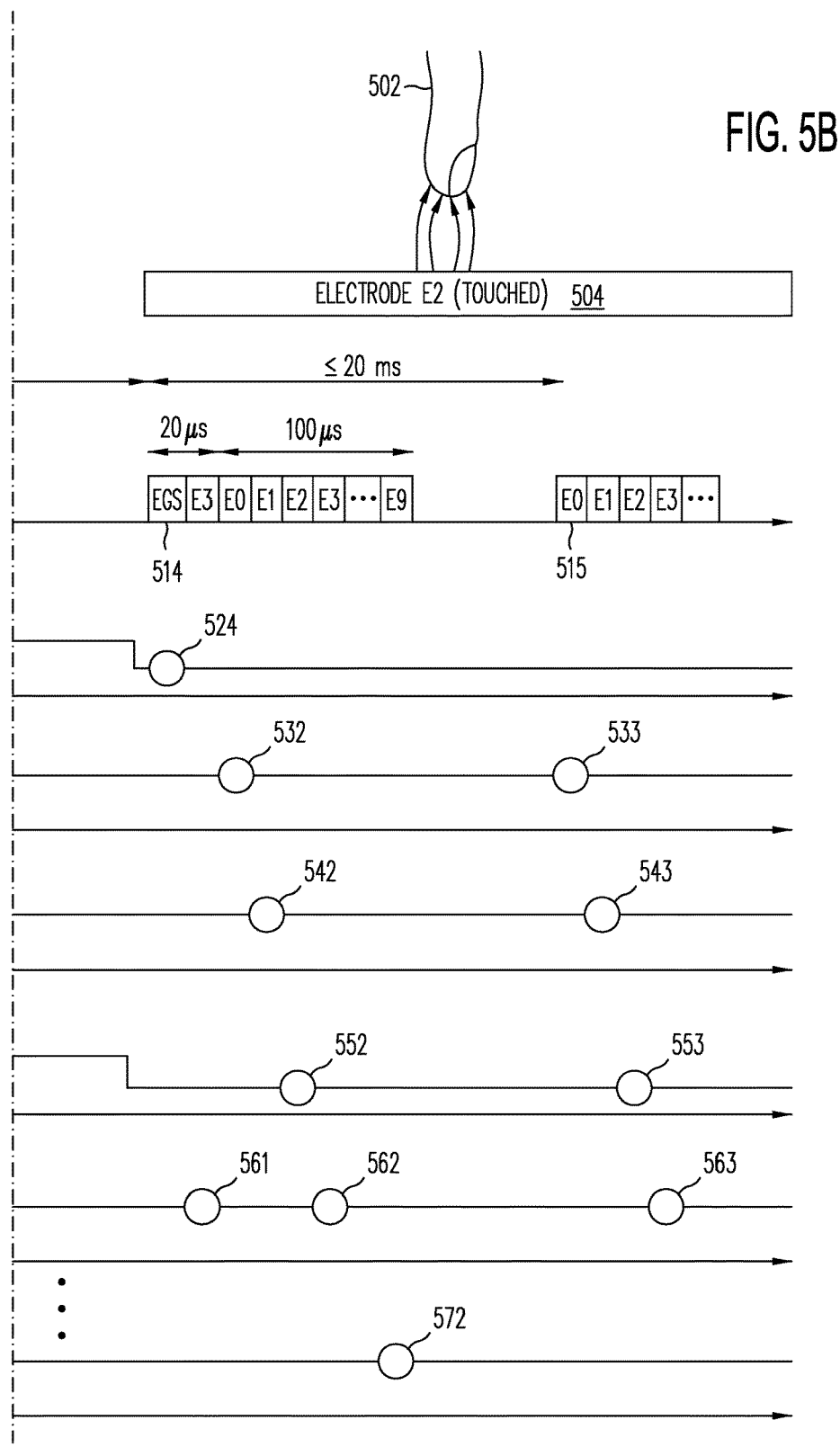

To illustrate how a global capacitive touch sense electrode may be used to detect crosstalk with an activated keypad key and initiate sequential scanning of the keypad key electrodes with fewer computational resources and reduced power consumption, reference is now made to FIG. 5 which graphically depicts output timing waveforms of an example timing sequence in which a keypad key (e.g., E2) is touched. In the first illustrated the timing waveform 510, it will be appreciated that the depicted scaling of the waveforms is adjusted for purposes of illustrating the operation. In particular, there is shown a plurality of scanning cycles 511-515 that are applied at a predetermined cycling rate (e.g., every 20 milliseconds), depending on whether a keypad key has been touched. Up until such time as a keypad touch is first detected, the scanning cycles 511-514 may include an EGS sensing cycle to periodically scan the global capacitive touch sense electrode, where each EGS sensing cycle has a set duration (e.g., 10 μseconds). As depicted in the waveform 520, each of the EGS sensing cycles in the scanning cycles 511-514 results in a corresponding electrode sample event 521-524 for sampling the capacitive voltage 520 at the global touch sense electrode ($VCAP_{EGS}$). However, once a keypad touch event is detected, the scanning cycles (e.g., 514, 515) may discontinue the EGS sensing cycles, and instead initiate sequential scanning of the keypad key electrodes with a plurality of additional sensing cycles (e.g., E0-E9) to sequentially sample the capacitive electrode voltages at each keypad key (e.g., 532, 542, 552, 562, 572).

When there is no touch detected at the keypad ("No Touch"), each EGS sensing cycle in the timing waveform 510 may be accompanied by an additional sensing cycle (En) that is applied at the same cycling rate to sequentially step through the keypad electrodes for purposes of capturing the baseline voltage values. The additional sending cycle may also be applied with the first EGS sensing cycle when a keypad touch is first detected. In the timing waveform 510, the additional sensing cycles (En) are shown as E0, E1, and E2, alone or in combination with the first E3 sensing cycle of the sensing cycle 514. As depicted in the waveforms 530, 540, and 550, these additional sensing cycles (En) result in the electrode sample events 531, 541, 551, 561 respectively, for sampling the capacitive voltages at the first keypad electrode ($VCAP_{E0}$), second keypad electrode ($VCAP_{E1}$), and third keypad electrode ($VCAP_{E2}$). Though not shown, it will be appreciated that the process of sequentially stepping through the keypad electrodes may continue until such time as a keypad touch event is detected. However, during the "No Touch" mode, the sensing cycles consume a small portion (e.g., 20 μseconds) of computational resources and power supply at each periodic scanning event, providing a significant performance improvement over conventional keypad sensing schemes which test every key electrode for touch events, even when in low power or sleep mode.

Once one of the keypad keys is capacitively activated or "touched" 504, the crosstalk between the "touched" keypad key and the global capacitive touch sense electrode may be sensed during the EGS sensing cycle in the timing waveform 510. For example, FIG. 5 graphically illustrates that, as a user's finger 502 comes into capacitive contact with a keypad key (e.g., electrode E2) 504, this is detected when the scanning cycle 514 triggers the EGS electrode sample event 524 to detect that the capacitive voltage 520 at the global touch sense electrode ($VCAP_{EGS}$) has changed (e.g., decreased). At this point, capacitive voltage 550 at the "touched" electrode (E2) is also decreased, but the specific location of the touched keypad key cannot be determined from the global capacitive touch sense electrode measurement 524. In order to locate the specific key being touched, the controller adjusts the keypad scanning so that the scanning cycles 514, 515 in the timing waveform 510 each include by a plurality of additional sensing cycles (e.g., E0-E9) that are applied to sequentially scan all of the keypad key electrodes to identify which keypad key is being capacitively touched. As depicted in the waveforms 530, 540, 550, 560, 570, the plurality of additional sensing cycles (E0-E9) result in the electrode sample events 532, 542, 552, 562, 572, respectively, for sampling the capacitive voltages at the first keypad electrode ($VCAP_{E0}$), second keypad electrode ($VCAP_{E1}$), third keypad electrode ($VCAP_{E2}$), fourth keypad electrode ($VCAP_{E3}$), and continuing to the last keypad electrode (e.g., $VCAP_{E9}$) in order to locate which specific keypad key was capacitively touched. This periodic sequence of sensing cycles E0-E9 may be repeated at the same predetermined cycling rate (e.g., every 20 milliseconds) or more frequently (e.g., less than every 20 milliseconds) to generate additional electrode sampling events 533, 543, 553, 563, etc. until such time as the electrode (e.g., E2) is released, at which point the electrode sample event for sampling the capacitive voltage at the corresponding keypad electrode ($VCAP_{E2}$) changes (e.g., increases) to indicate that the key has been released.

Figure 6:
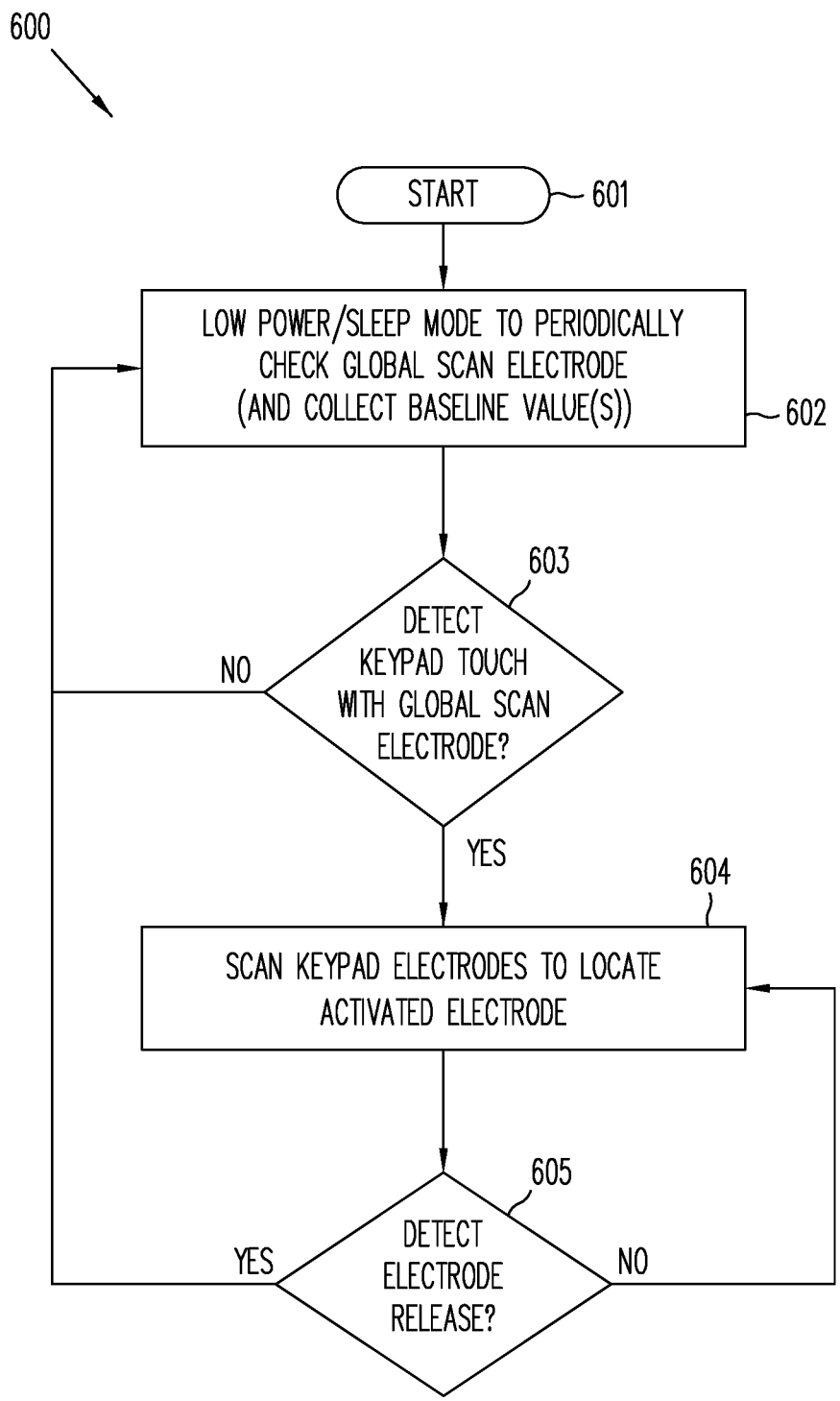
FIG. 6 illustrates simplified flow chart showing the logic for switching between a low power mode and keypad electrode scan mode in accordance with selected embodiments of the present disclosure.

To provide additional details for an improved understanding of selected embodiments of the present disclosure, reference is now made to FIG. 6 which depicts a simplified flow chart 600 showing the logic for switching between a low power mode and keypad electrode scan mode in accordance selected embodiments of the present disclosure. In an example embodiment, the control logic and methodology shown in FIG. 6 may be implemented as hardware and/or software on a host computing system, processor, or microcontroller unit that includes processor and memory for storing programming control code for performing the capacitive touch sense unit functionality described herein.

After starting (step 601), the process enters a low power or sleep mode (step 602) wherein the global scan electrode is checked to detect whether any of the keypad electrodes have been touched. In selected embodiments, the low power mode checks the global scan electrode by periodically monitoring the voltage measure of the crosstalk between the global scan electrode and the keypad electrodes with a sensing cycle that is by periodically applied to measure the voltage at the global scan electrode. In other embodiments, the global scan electrode sensing cycle may be accompanied by an additional sensing cycle that is periodically applied to collect a baseline reference voltage measurement from a different keypad electrode at each periodic scanning cycle. In this way, baseline reference voltage measurement can be collected over a plurality of periodic scanning intervals for use in evaluating whether a touch event has occurred at each keypad electrode.

Based on the voltage measured at the global scan electrode, keypad touch events may be detected (at step 603). For example, if there is no change to the global scan electrode voltage (or change that does not exceed a specified threshold), there is no keypad touch detected (negative outcome to detection step 603), and the process stays in the low power mode. However, if an electrode is touched, this changes the capacitance of the measured system, and therefore changes the voltage measurement at the global scan electrode to indicate that at touch event is detected (affirmative outcome to detection step 603).

Since the detection of a touch event with the global scan electrode at step 603 does not specify which keypad electrode was touched, the process proceeds to enter a keypad scan mode (step 604) where each of the keypad electrodes is scanned to locate which keypad electrode was activated or touched. For example, the keypad scan processing at step 604 may periodically scan all of the keypad electrodes (e.g., at periodic scanning intervals) to detect which keypad electrode was touched. As indicated with the electrode release detection step (step 605), the scanning of all of the keypad electrodes may continue (negative outcome to detection step 605) until detecting that the keypad electrode is released (affirmative outcome to detection step 605), at which point the method reverts back to the low power or sleep mode (step 602) where only a subset of the electrodes, including at least the global scan electrode, are scanned.

By now it should be appreciated that there has been provided a capacitive keypad sensing apparatus, method, program code, and system for detecting keypad touch events. In the disclosed embodiments, a keypad touch panel is provided that has a plurality of defined key areas. Under the keypad touch panel, a plurality of capacitive key electrodes and a keypad sensing electrode are arrayed so that the capacitive key electrodes are respectively aligned with the defined key areas and so that the keypad sensing electrode is disposed within sensing proximity of the capacitive key electrodes to facilitate touch detection at the keypad touch panel. In selected embodiments, the capacitive electrodes and keypad sensing electrode are formed over a substrate in a single conductive layer with the keypad sensing electrode surrounding the capacitive electrodes, while in other embodiments, the capacitive electrodes and keypad sensing electrode are formed with separate conductive layers in a substrate so that the keypad sensing electrode is located below the plurality of capacitive electrodes. To enable keypad touch event detection, the controller may be configured to determine which of the plurality of defined key areas is being touched by detecting a predetermined signal characteristic at the keypad sensing electrode before sequential scanning the plurality of capacitive key electrodes to identify which capacitive key electrode is aligned with a defined key area being touched. In selected embodiments, the controller may be configured to detect the predetermined signal characteristic at the keypad sensing electrode at each of a plurality of periodic scanning cycles by measuring the keypad sensing electrode with a first sensing cycle to detect when any of the plurality of defined key areas is being touched. In addition, the controller may also be configured to measure a baseline reference voltage from a different capacitive electrode from the plurality of capacitive electrodes at each of the plurality of periodic scanning cycles. To this end, the controller may be configured to sequentially scan the plurality of capacitive key electrodes to identify which capacitive key electrode is aligned with the defined key area being touched by comparing a measured voltage from each capacitive key electrode with the baseline reference voltage measured for said capacitive key electrode.

In another form, there is provided an electronic device having a keypad and a controller which are connected and operated to detect keypad touch events. As disclosed, the keypad includes a keypad touch panel having a dielectric layer with a touch surface defining a plurality of key areas. The keypad also includes a plurality of key electrodes and a global sense electrode located adjacent to the keypad touch panel, where each key electrode is approximately the same area as a correspondingly aligned key area and is respectively aligned with the plurality of key areas, and where the global sense electrode is disposed within sensing proximity of the plurality of key electrodes to detect when the keypad touch panel is capacitively activated. In selected embodiments, the plurality of key electrodes and the global sense electrode are formed in a single conductive layer, while in other embodiments, the plurality of key electrodes is formed in a first conductive layer and the global sense electrode is formed in a second, different conductive layer. The disclosed controller may be configured to operate the keypad in a sleep mode when the global sense electrode detects that the keypad touch panel is not capacitively activated, and to operate the keypad in a keypad scan mode when the global sense electrode detects that the keypad touch panel is capacitively activated. In selected embodiments, the controller may be implemented with a capacitive touch sense microcontroller with a plurality of connection input signal lines connected, respectively, to the plurality of key electrodes and the global sense electrode. In the sleep mode, the controller may be configured to detect when the keypad touch panel is capacitively activated by detecting when the global sense electrode has a first predetermined signal characteristic which is caused by crosstalk with the plurality of key electrodes that occurs when an external object comes within proximity sensing distance of the touch surface of the keypad touch panel. For example, the controller may be configured to detect when the keypad touch panel is capacitively activated by periodically sampling a voltage at the global sense electrode to detect crosstalk with the plurality of key electrodes. In selected embodiments, the controller may be configured to operate the keypad in the sleep mode by periodically scanning (1) the global sense electrode to detect when the keypad touch panel is capacitively activated and (2) only a selected key electrode from the plurality of key electrodes during each periodic scan cycle to measure a baseline reference voltage from the selected key electrode at each periodic scan cycle. In such embodiments, the controller may be configured to adjust keypad sensor performance over time based on the baseline reference voltages measured from each key electrode. In the keypad scan mode, the controller may be configured to sequentially scan the plurality of key electrodes to determine which key electrode is being capacitively activated by detecting which key electrode has a second predetermined signal characteristic which is caused by sensing proximity of an external object to the touch surface of the keypad touch panel in a key area over said key electrode.

In yet another form, there is disclosed a method for sensing proximity of an object to a keypad. In the disclosed method, the keypad operates in a low power mode and a keypad scanning mode. In the low power mode, the keypad is operated by periodically scanning a keypad sensing electrode disposed around or under a plurality of capacitive key electrodes in the keypad to detect crosstalk between the keypad sensing electrode and the plurality of capacitive key electrodes when the object capacitively activates the keypad. In selected embodiments, the low power mode may include periodically scanning the keypad sensing electrode and a selected single capacitive key electrode from the plurality of key electrodes during a periodic scan cycle for the low power mode to measure a baseline reference voltage from the selected single capacitive key electrode at each periodic scan cycle. In the keypad scan mode, the keypad is operated by sequentially scanning the plurality of capacitive key electrodes to identify which capacitive key electrode is being capacitively activated by the object only after detecting crosstalk between the keypad sensing electrode and the plurality of capacitive key electrodes. Finally, keypad operation may revert to the low power mode when sequential scanning of the plurality of capacitive key electrodes detects that a capacitively activated capacitive key electrode is no longer being capacitively activated by the object.

Although the described exemplary embodiments disclosed herein for an enhanced capacitive keypad design are described with reference to various implementation details for automotive applications, the present invention is not necessarily limited to the example embodiments illustrate herein. For example, various embodiments may be implemented in industrial equipment or home appliance using a touch panel, point of sales with touch screen, portable electronics as cell phones or MP3 players, medical equipment and almost any device using touch panels or keypad touch screens. The methods and systems for enhancing the design of a capacitive keypad as shown and described herein may be implemented using a variety of different electrode shapes and geometries, provided that a single logical electrode is shared by a group of keypad electrodes to provide a crosstalk measure of any keypad touch event with reduced power consumption and/or power computational requirements. The enhanced design of the electrode shape and layout also saves costs by providing an efficient technique that can be implemented in touch screens, touch panels or capacitive membranes with a relatively thick dielectric and using only one electric field or proximity sensor, implemented in a single conductor layer and without reduced sensitivity. In addition, the enhanced design allows valid accurate electrode touch detections which take into account changing operating conditions and process variations by accumulating baseline reference voltage measurements over time. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the circuit designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. In addition, some portions of the detailed descriptions provided herein are presented in terms of algorithms or operations on data within a computer memory. Such descriptions and representations are used by those skilled in the art to describe and convey the substance of their work to others skilled in the art.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A capacitive keypad sensing apparatus, comprising:
   a keypad touch panel comprising a plurality of defined key areas;
   a plurality of capacitive key electrodes and a keypad proximity sensing electrode arrayed under the keypad touch panel, wherein the plurality of capacitive key electrodes is respectively aligned with the plurality of defined key areas and wherein the keypad proximity sensing electrode is disposed within sensing proximity of the plurality of capacitive key electrodes to facilitate touch detection at the keypad touch panel; and
   a controller configured to determine which of the plurality of defined key areas is being touched by first detecting a predetermined signal characteristic at the keypad proximity sensing electrode to sense proximity of an object to the keypad before detecting which capacitive key electrode is being activated by sequential scanning the plurality of capacitive key electrodes to identify which capacitive key electrode is aligned with a defined key area being touched.

2. The capacitive keypad sensing apparatus of claim 1, where the plurality of capacitive electrodes and keypad proximity sensing electrode are formed over a substrate in a single conductive layer with the keypad proximity sensing electrode surrounding the plurality of capacitive electrodes.

3. The capacitive keypad sensing apparatus of claim 1, where the plurality of capacitive electrodes and keypad proximity sensing electrode are formed with separate conductive layers in a substrate so that the keypad proximity sensing electrode is located below the plurality of capacitive electrodes.

4. The capacitive keypad sensing apparatus of claim 1, where the controller is configured to detect the predetermined signal characteristic at the keypad proximity sensing electrode at each of a plurality of periodic scanning cycles by measuring the keypad proximity sensing electrode with a first sensing cycle to detect when any of the plurality of defined key areas is being touched.

5. The capacitive keypad sensing apparatus of claim 4, where the controller is configured to measure a baseline reference voltage from a different capacitive electrode from the plurality of capacitive electrodes at each of the plurality of periodic scanning cycles.

6. The capacitive keypad sensing apparatus of claim 5, where the controller is configured to sequentially scan the plurality of capacitive key electrodes to identify which capacitive key electrode is aligned with the defined key area being touched by comparing a measured voltage from each capacitive key electrode with the baseline reference voltage measured for said capacitive key electrode.

7. An electronic device, comprising:
   a keypad comprising:
   a keypad touch panel comprising a dielectric layer having a touch surface defining a plurality of key areas, and
   a plurality of key electrodes and a global sense electrode located adjacent to the keypad touch panel, wherein the plurality of key electrodes is respectively aligned with the plurality of key areas and wherein the global sense electrode is disposed within sensing proximity of the plurality of key electrodes to detect when the keypad touch panel is capacitively activated; and
   a controller configured to operate the keypad in a sleep mode when periodic scanning of only the global sense electrode detects that the keypad touch panel is not capacitively activated, and to operate the keypad in a keypad scan mode when periodic scanning of only the global sense electrode detects that the keypad touch panel is capacitively activated.

8. The electronic device of claim 7, where the controller comprises a capacitive touch sense microcontroller with a plurality of connection input signal lines connected, respectively, to the plurality of key electrodes and the global sense electrode.

9. The electronic device of claim 7, where each key electrode is approximately the same area as a correspondingly aligned key area.

10. The electronic device of claim 7, where the controller is configured to detect when the keypad touch panel is capacitively activated by detecting when the global sense electrode has a first predetermined signal characteristic which is caused by crosstalk with the plurality of key electrodes that occurs when an external object comes within proximity sensing distance of the touch surface of the keypad touch panel.

11. The electronic device of claim 10, where the controller is configured to detect when the keypad touch panel is capacitively activated by periodically sampling a voltage at the global sense electrode to detect crosstalk with the plurality of key electrodes.

12. The electronic device of claim 7, where the controller is configured to operate the keypad in the keypad scan mode to determine which of the plurality of key electrodes is being capacitively activated by detecting which key electrode has a second predetermined signal characteristic which is caused by sensing proximity of an external object to the touch surface of the keypad touch panel in a key area over said key electrode.

13. The electronic device of claim 7, where the plurality of key electrodes and the global sense electrode are formed in a single conductive layer.

14. The electronic device of claim 7, where the plurality of key electrodes is formed in a first conductive layer and where the global sense electrode is formed in a second, different conductive layer.

15. The electronic device of claim 7, where the controller is configured to operate the keypad in the sleep mode by periodically scanning (1) the global sense electrode to detect when the keypad touch panel is capacitively activated and (2) only a selected key electrode from the plurality of key electrodes during each periodic scan cycle to measure a baseline reference voltage from the selected key electrode at each periodic scan cycle.

16. The electronic device of claim 15, where the controller is configured to adjust keypad sensor performance over time based on the baseline reference voltages measured from each key electrode.

17. The electronic device of claim 7, where the controller is configured to operate the keypad in the keypad scan mode by sequentially scanning the plurality of key electrodes to identify which key electrode is being capacitively activated.

18. A method for operating a keypad comprising a plurality of capacitive key electrodes and a keypad sensing electrode disposed around or under the plurality of capacitive key electrodes, comprising:
sensing proximity of an object to the keypad while operating the keypad in a low power mode by periodically scanning only the keypad sensing electrode to detect crosstalk between the keypad sensing electrode and the plurality of capacitive key electrodes when the object capacitively activates the keypad; and
operating the keypad in a keypad scan mode by sequentially scanning the plurality of capacitive key electrodes to identify which capacitive key electrode is being capacitively activated by the object only after detecting crosstalk between the keypad sensing electrode and the plurality of capacitive key electrodes.

19. The method of claim 18, further comprising reverting operation of the keypad to the low power mode when sequential scanning of the plurality of capacitive key electrodes detects that a capacitively activated capacitive key electrode is no longer being capacitively activated by the object.

20. The method of claim 18, further comprising periodically scanning a selected single capacitive key electrode from the plurality of key electrodes during a periodic scan cycle for the low power mode to measure a baseline reference voltage from the selected single capacitive key electrode.

* * * * *